(12) United States Patent
Noda et al.

(10) Patent No.: US 9,130,339 B2
(45) Date of Patent: Sep. 8, 2015

(54) END-FACE-EMITTING PHOTONIC CRYSTAL LASER ELEMENT

(75) Inventors: Susumu Noda, Kyoto (JP); Yoshitaka Kurosaka, Hamamatsu (JP); Akiyoshi Watanabe, Hamamatsu (JP); Kazuyoshi Hirose, Hamamatsu (JP); Takahiro Sugiyama, Hamamatsu (JP)

(73) Assignees: KYOTO UNIVERSITY, Kyoto-shi, Kyoto (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/347,780

(22) PCT Filed: Aug. 31, 2012

(86) PCT No.: PCT/JP2012/072185
§ 371 (c)(1),
(2), (4) Date: Apr. 11, 2014

(87) PCT Pub. No.: WO2013/047086
PCT Pub. Date: Apr. 4, 2013

(65) Prior Publication Data
US 2014/0247852 A1  Sep. 4, 2014

(30) Foreign Application Priority Data
Sep. 30, 2011 (JP) .................. P2011-217736

(51) Int. Cl.
*H01S 5/00* (2006.01)
*H01S 5/042* (2006.01)
(Continued)

(52) U.S. Cl.
CPC ............. *H01S 5/0421* (2013.01); *H01S 5/105* (2013.01); *H01S 5/0425* (2013.01); *H01S 5/0653* (2013.01); *H01S 5/1203* (2013.01); *H01S 5/34313* (2013.01); *H01S 5/34353* (2013.01)

(58) Field of Classification Search
CPC ............................ H01S 5/105; H01S 5/18319
USPC ..................... 372/45.013, 102, 105
See application file for complete search history.

(56) References Cited

U.S. PATENT DOCUMENTS

| 6,674,778 B1 * | 1/2004 | Lin et al. ................ 372/46.01 |
| 7,539,228 B2 * | 5/2009 | Codato et al. ............ 372/45.01 |

(Continued)

FOREIGN PATENT DOCUMENTS

| JP | S59-044884 | 3/1984 |
| JP | S61-084890 | 4/1986 |

(Continued)

OTHER PUBLICATIONS

Watanabe, Akiyoshi, et al., "Fabrication of the Edge•Emitting LDs with 2D Photonic Crystal (1)", Proceedings of the 58th Meeting of the Japan Society of Applied Physics and Related Societies, 26a-KA-3, 2011 (along with its English-language translation).
Sakai, Kyosuke, et al., "Coupled-Wave Theory for Square-Lattice Photonic Crystal Lasers with TE Polarization," IEEE J. Quantum Electron, 46, pp. 788-795, 2010.

*Primary Examiner* — Colleen A Matthews
*Assistant Examiner* — Vu A Vu
(74) *Attorney, Agent, or Firm* — Drinker Biddle & Reath LLP

(57) ABSTRACT

When an end-face-emitting photonic crystal laser element 10 is seen in an X axis, one end of an upper electrode E2 overlaps a laser light exit surface SF, the upper electrode E2 and an opposite end face SB are separated from each other, the upper electrode E2 is separated from both lateral end faces SR, SL, and one end of an active layer 3B overlaps the laser light exit surface SF.

5 Claims, 13 Drawing Sheets

(51) Int. Cl.
*H01S 5/10* (2006.01)
*H01S 5/12* (2006.01)
*H01S 5/065* (2006.01)
*H01S 5/343* (2006.01)

(56) References Cited

U.S. PATENT DOCUMENTS

2009/0315078 A1* 12/2009 Parikh et al. .................. 257/194
2010/0246625 A1* 9/2010 Kawashima et al. ...... 372/45.01

FOREIGN PATENT DOCUMENTS

| JP | H2-034982 | 2/1990 |
| JP | H6-252448 | 9/1994 |
| JP | H11-121861 | 4/1999 |
| JP | 2001-156390 | 6/2001 |
| JP | 2004-172506 | 6/2004 |
| JP | 2012-190847 | 10/2012 |

* cited by examiner

Fig. 7

| Actual structure | Material | Thickness |
|---|---|---|
| Contact layer 6 | p-type GaAs | 50~500nm |
| Upper cladding layer 5 | p-type AlXGa1-XAs X=0.4 | 1.0~3.0μm |
| Diffraction grating layer 4 | 4A: GaAs 4B: AlXGa1-XAs X=0.4 | 50~200nm |
| Carrier block layer 3D | AlXGa1-XAs X=0.4 | 50~200nm |
| Spacer layer 3C | GaAs | 10~200nm |
| Active layer 3B(MQW) | InGaAs/ AlXGa1-XAs X=0.1 | 10~100nm |
| Guide layer 3A | AlXGa1-XAs X=0.1 | 0~300nm |
| Lower cladding layer 2 | n-type AlXGa1-XAs X=0.7 | 1.0~3.0μm |
| Semiconductor substrate 1 | n-type GaAs | 80~350μm |

END-FACE-EMITTING PHOTONIC CRYSTAL LASER ELEMENT

TECHNICAL FIELD

The present invention relates to an end-face-emitting photonic crystal laser element.

BACKGROUND ART

A conventional end-face-emitting photonic crystal laser element is one forming an n-type cladding layer, an active layer, a diffraction grating layer (photonic crystal layer), and a p-type cladding layer in sequence on a semiconductor substrate and arranging drive electrodes on the upper and lower faces of thus formed substrate, respectively. Their semiconductor materials are those based on AlGaAs and can change their refractive indexes and energy bandgaps by altering their composition ratios of Al. Assuming that X, Y, and Z axes lie in the thickness, longitudinal, and width directions of the substrate, respectively, the upper-face electrode is elongated along the Z axis. Both end faces perpendicular to the Z axis are provided with non-reflective and high-reflective coatings, respectively. Even without the high-reflective coating, the semiconductors have a refractive index higher than that of air (=1), whereby light generated therein tends to be confined within the semiconductors.

Light generated in the active layer also exists in the photonic crystal layer and produces a two-dimensional resonant state under the influence of diffraction by the photonic crystal layer. A part of the light in the two-dimensional resonant state is taken out as optical output from the end face provided with the non-reflective coating. Unlike typical Fabry-Perot lasers, modes are also defined in ±Y and ±Z directions under the effect of the photonic crystal, whereby a broad-area, single transverse and longitudinal mode semiconductor laser can be attained.

CITATION LIST

Non Patent Literature

Non Patent Literature 1: WATANABE Akiyoshi et al., "Fabrication of Edge-Emitting LDs with 2D Photonic Crystal (1)," Proceedings of the 58th Meeting of the Japan Society of Applied Physics and Related Societies, 26a-KA-3 (2011).

Non Patent Literature 2: SAKAI Kyosuke et al., "Coupled-Wave Theory for Square-Lattice Photonic Crystal Lasers With TE Polarization," IEEE J. Quantum Electron. 46, 788-795 (2010).

SUMMARY OF INVENTION

Technical Problem

In an end-face-emitting photonic crystal laser element such as the one mentioned above, however, there is a mixture of a mode caused by reciprocation of light between both end faces perpendicular to the Z axis (hereinafter referred to as Fabry-Perot mode) and a mode occurring because of light in the diffraction grating layer comprised of the two-dimensional photonic crystal, whereby stable laser light is not generated sufficiently under the influence of the mixture of modes.

It is an object of an aspect of the present invention to provide an end-face-emitting photonic crystal laser element which can emit stable laser light.

Solution to Problem

For achieving the above-mentioned object, the end-face-emitting photonic crystal laser element in accordance with an aspect of the present invention comprises a lower cladding layer comprised of a semiconductor; an upper cladding layer comprised of a semiconductor; an active layer constituted by a quantum well layer disposed between the lower and upper cladding layers, the quantum well layer having a plurality of barrier layers and a well layer located between the barrier layers, the barrier layers having an energy band gap smaller than that of any of the lower and upper cladding layers; a diffraction grating layer having a region disposed between at least one of the lower and upper cladding layers and the active layer; a lower electrode disposed on a surface of the lower cladding layer; and an upper electrode disposed on a surface of the upper cladding layer; wherein, in an XYZ orthogonal coordinate system with X, Y, and Z axes respectively lying in thickness, width, and length directions of the element, the end-face-emitting photonic crystal laser element has a laser light exit surface along an XY plane; wherein the end-face-emitting photonic crystal laser element has four end faces surrounding the X axis; wherein one of the end faces is the laser light exit surface; and wherein, when referring to the surface opposing the laser light exit surface in the end faces as an opposite end face and the remaining pair of end faces as lateral end faces and seeing in the X axis, one end of the upper electrode overlaps the laser light exit surface, the upper electrode and the opposite end face are separated from each other, the upper electrode is separated from both of the lateral end faces, and one end of the active layer overlaps the laser light exit surface.

In the above-mentioned two kinds of modes in the end-face-emitting photonic crystal laser element, the Fabry-Perot mode is suppressed in the aspect of the present invention in order for the latter mode (the mode dependent on the diffraction grating layer) to become relatively dominant.

When a drive current flows between the upper and lower electrodes, carrier recombination occurs in the active layer, thereby emitting light. When thus generated light passes through the active layer while in a state where a population inversion is famed by injecting carriers into the active layer, stimulated emission occurs, thereby producing laser light. Here, the Fabry-Perot mode occurring between the laser light exit surface and the opposite end face is suppressed. That is, the upper electrode is separated from the opposite end face, so that no carriers are injected into the gap therebetween, whereby no laser light occurs there. Hence, the Fabry-Perot mode occurring between the laser light exit surface and the opposite end face is suppressed.

The upper electrode is also separated from the lateral end faces, so that no carriers are injected into the active layer in a region corresponding to the resulting gaps, whereby no laser light occurs there. Hence, the Fabry-Perot mode occurring between the laser light exit surface and the opposite end face is suppressed.

Therefore, the Fabry-Perot mode is relatively suppressed, so that the mode dependent on the diffraction grating layer becomes dominant. The light generated by the carrier recombination in the active layer also reaches the inside of the diffraction grating layer, and a specific wavelength component thereof selectively passes through the diffraction grating layer and returns into the active layer. This light inductively generates laser light within the active layer, and a part of the laser light exits from the laser light exit surface.

For suppressing the above-mentioned Fabry-Perot mode at the end faces other than the light exit surface in the active layer, it is preferable for these end faces to inhibit reflections. This is because a reflecting surface, if any, may become one mirror in the resonator and induce the Fabry-Perot mode. Assuming the refractive index of air to be 1, a semiconductor has a refractive index greater than 1. Therefore, when an end face of an active layer comprised of the semiconductor is exposed to air, a large refractive index difference exists therebetween, which causes reflection. The reflectance becomes higher as the refractive index difference is greater. When a semiconductor material is in contact with an end face of the active layer, the refractive index difference becomes smaller, so as to lower the reflectance, thereby suppressing the Fabry-Perot mode.

When the semiconductor material in contact with the end face of the active layer is transparent to a laser resonance wavelength of the Fabry-Perot mode, i.e., has a broad energy bandgap, the absorption and reflection within the semiconductor material are suppressed. The laser resonance wavelength roughly corresponds to the energy bandgap for the well layer in the active layer. In general, wavelength $\lambda$ (nm) and energy bandgap Eg (eV) have the relationship of $\lambda=1240/Eg$ therebetween and thus are in inverse proportion to each other. That is, when the energy bandgap of a semiconductor material is wider than that of the well layer, the absorption and reflection within the semiconductor material can be suppressed.

This makes it preferable for the end-face-emitting photonic crystal laser element in accordance with the aspect of the present invention, when seen in the X axis, to separate the active layer and the opposite end face from each other, separate the active layer from both of the lateral end faces, and bring the active layer into contact with a semiconductor material having a wider energy bandgap than that of the well layer except for the laser light exit surface within a YZ plane including the active layer.

In this case, since the end face of the active layer is in contact with the semiconductor material as mentioned above, the refractive index difference between the active layer and the semiconductor material is smaller than that obtained in contact with air, and the fact that the semiconductor material has a broad energy bandgap can inhibit the absorption and reflection within the semiconductor material, thereby further suppressing the Fabry-Perot mode. Here, the refractive index means the average refractive index within a region involved with light propagation.

As for the transparency of the semiconductor material, the laser resonance wavelength has a wavelength component corresponding to an energy bandgap slightly wider than that at a band end of the well layer.

This makes it preferable for the semiconductor material to have an energy bandgap wider than that corresponding to the laser resonance wavelength along the Z axis in the active layer. In this case, the semiconductor material becomes transparent to the laser light at the laser resonance wavelength.

The diffraction grating layer may comprise a base layer comprised of the semiconductor material and a plurality of different refractive index parts, located periodically within the base layer, having a refractive index different from that of the base layer, the base layer being in contact with the active layer within the YZ plane including the active layer.

That is, a simple structure in which a partial region of the base layer constituting the diffraction grating layer is brought as the above-mentioned semiconductor material into contact with an end face of the active layer can form a structure for suppressing the above-mentioned Fabry-Perot mode.

Advantageous Effects of Invention

The end-face-emitting photonic crystal laser element of the present invention can suppress the Fabry-Perot mode mixed with the mode of laser light resulting from the diffraction grating layer, thereby making it possible to emit stable laser light.

BRIEF DESCRIPTION OF DRAWINGS

FIG. 7 is a chart illustrating a layer structure of the semiconductor laser element;

FIG. 8 is a set of diagrams illustrating a method for manufacturing the semiconductor laser element, in which FIGS. 8(A) to 8(F) represent respective structures of semiconductor laser element intermediates;

FIG. 9 is a set of diagrams illustrating a method for manufacturing the semiconductor laser element, in which FIGS. 9(G) to 9(L) represent respective structures of semiconductor laser element intermediates;

FIG. 10 is a set of diagrams illustrating a method for manufacturing the semiconductor laser element, in which FIGS. 10(M) to 10(R) represent respective structures of semiconductor laser element intermediates;

DESCRIPTION OF EMBODIMENTS

In the following, an end-face-emitting photonic crystal laser element in accordance with an embodiment will be explained. The same constituents will be referred to with the same signs while omitting their overlapping descriptions.

Figure 1:
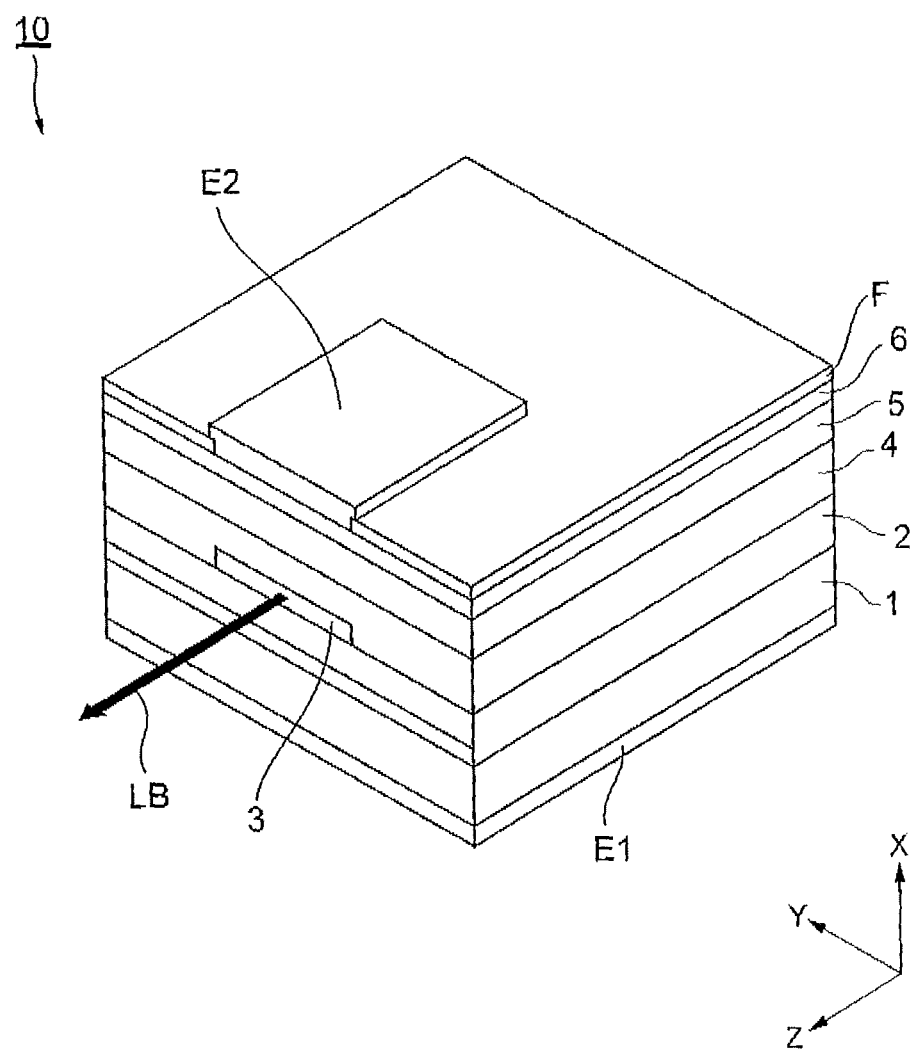
FIG. 1 is a perspective view of a semiconductor laser element.

FIG. 1 is a perspective view of the end-face-emitting photonic crystal laser element.

A semiconductor laser element 10 has a three-dimensional form of a rectangular parallelepiped. In an XYZ orthogonal coordinate system with X, Y, and Z axes respectively lying in thickness, width, and length directions of the element, a laser light exit surface is located parallel to an XY plane. The laser light exit surface emits laser light LB along the Z axis. When an orthorhombic semiconductor constituent material is employed, the semiconductor laser element 10 may have a three-dimensional form of a parallelepiped. In this case, the laser light exit surface extends along the XY plane as in the case where the semiconductor laser element is a rectangular parallelepiped, but slightly tilts from the XY plane.

The semiconductor laser element 10 comprises a lower cladding layer 2, a light-emitting layer 3, a diffraction grating layer 4, an upper cladding layer 5, and a contact layer 6 which are sequentially disposed on a semiconductor substrate 1. Each of them is comprised of a semiconductor. The light-emitting layer 3 is a semiconductor layer located between the lower cladding layer 2 and the diffraction grating layer 4 and contains an active layer constituted by a quantum well layer. In this example, as FIG. 7 illustrates, the light-emitting layer 3 is preferably constructed by stacking a guide layer 3A, an active layer 3B, a spacer layer 3C, a carrier block layer 3D, and a guide layer 3E in sequence. The guide layer 3A has an energy bandgap wider than that of a barrier layer in the active layer 3B but narrower than that of any of the cladding layers. The spacer layer 3C is a layer for securing an appropriate distance between semiconductor layers and has an energy bandgap equivalent to that of the barrier layer. An insulating layer F made of $SiO_2$, SiNx, or the like is disposed on the contact layer 6 when necessary, while an upper electrode E2 is formed within an aperture provided in the insulating layer F.

The semiconductor laser element 10 comprises a lower electrode E1 provided all over the rear face of the semiconductor substrate 1 and an upper electrode E2 disposed on a partial region of a surface of the upper cladding layer 5. Applying a drive voltage between the lower and upper electrodes E1, E2, so that a drive current flows therebetween, can concentrate carriers into the active layer 3B in the light-emitting layer 3, whereby injected electrons recombine with holes in this region, thus emitting light. The emitted light resonates within the region between the cladding layers, i.e., a core layer containing the light-emitting layer 3 and diffraction grating layer 4, and then is let out as the laser light LB. The diffraction grating layer 4 determines a specific wavelength of laser light to resonate.

Not only the Fabry-Perot mode, which is a laser resonation along the Z axis, but the mode of a laser resonation resulting from the diffraction grating layer 4 and the like may also exist in the semiconductor laser element 10.

Light emission occurs basically in a path through which the drive current flows, i.e., a region directly under the upper electrode E2 where the electric resistance becomes lower. Examples of materials employable for the upper electrode E2 include metals such as Au, Ag, Cu, Ni, and Al and compound semiconductors doped with impurities at a high concentration of $1 \times 10^{19}/cm^3$ or more. The same holds for materials for the lower electrode E1.

Figure 6:
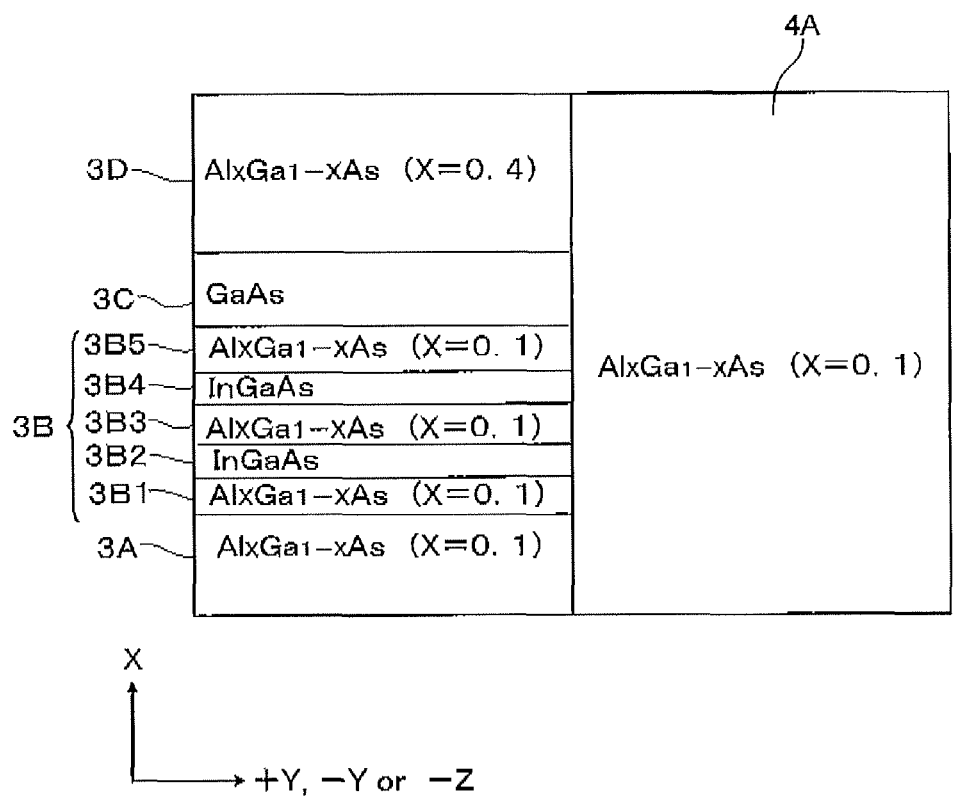
FIG. 6 is a diagram illustrating a semiconductor material in contact with an active layer.

More specifically, the active layer 3B is constituted by a quantum well layer disposed between the lower and upper cladding layers 2, 5. As FIG. 6 illustrates, the quantum well layer constituting the active layer 3B comprises a plurality of barrier layers 3B1, 3B3, 3B5 and well layers 3B2, 3B4 located therebetween. Each of the barrier layers 3B1, 3B3, 3B5 has an energy bandgap smaller than that of any of the lower and upper cladding layers 2, 5. Each of the well layers 3B2, 3B4 has an energy bandgap smaller than that of each of the barrier layers 3B1, 3B3, 3B5.

The diffraction grating layer 4, which is located between the active layer 3B and the upper cladding layer 5, may be disposed between the active layer 4B and the lower cladding layer 2, or both of these regions may be provided with diffraction grating layers. That is, the diffraction grating layer 4 has a region disposed between at least one of the lower and upper cladding layers 2, 5 and the active layer 3B.

Figure 2:
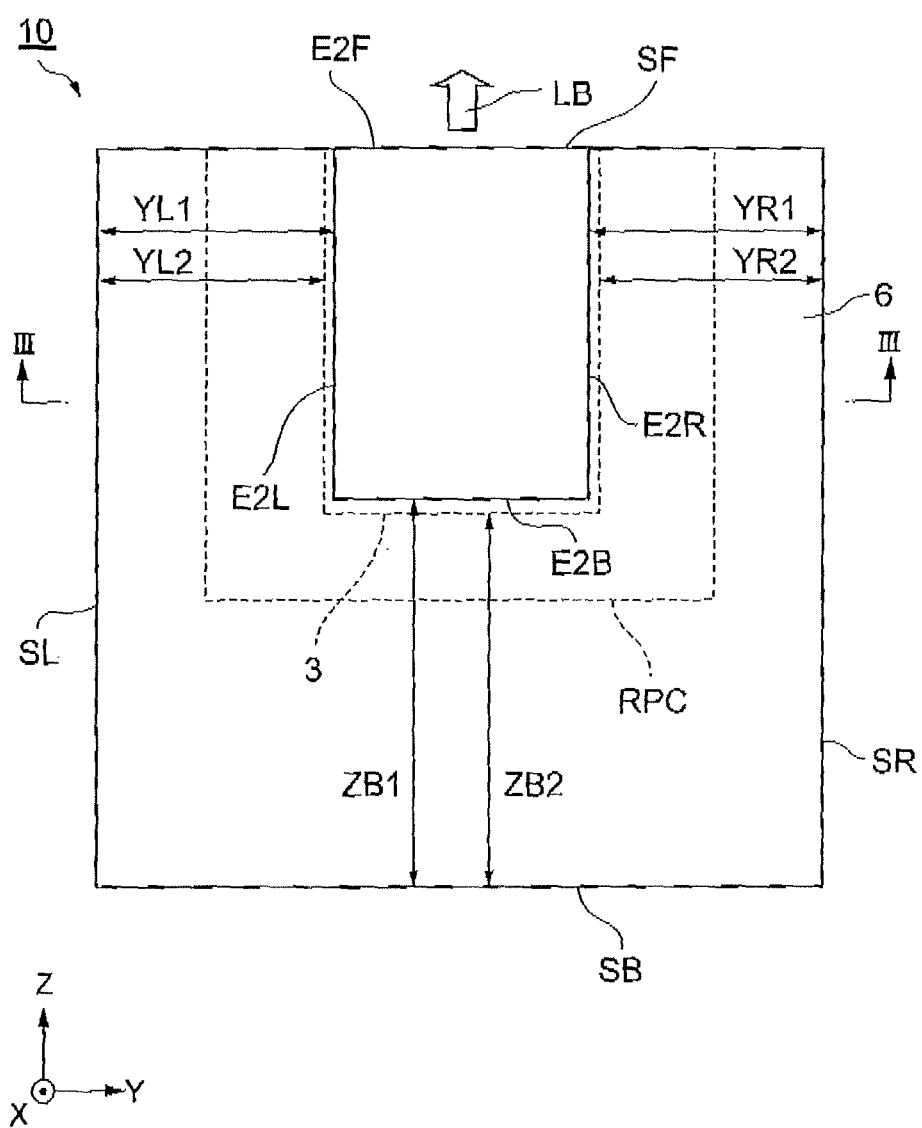
FIG. 2 is a plan view of the semiconductor laser element.

FIG. 2 is a plan view of the semiconductor laser element illustrated in FIG. 1.

The semiconductor laser element 10 has four end faces surrounding the X axis. They are a laser light exit surface SF, located on the front side in the +Z direction, extending along an XY plane; an opposite end face SB, located on the rear side opposite to the laser light exit surface SF, extending along an XY plane; and lateral end faces SR, SL extending along respective XZ planes. In other words, one of the four end faces is the laser light exit surface SF, one opposing the laser light exit surface SF in the end faces is the opposite end face SB, and the remaining pair of end faces are the lateral end faces SR, SL. The intersection lines between a YZ plane and the end faces are segments, which construct a rectangle.

When the semiconductor laser element 10 is seen in the X axis, one end E2F on the front side of the upper electrode E2 overlaps the laser light exit surface SF, one end E2B on the rear side of the upper electrode E2 is separated from the opposite end face SB by a distance ZB1, and ends E2R, E2L on both sides of the upper electrode E2 are separated from their corresponding lateral end faces SR, SL by distances YR1, YL1, respectively. When seen in the X axis, one end on the front side of the active layer 3B (at the same position as with one end E2F of the electrode E2 in the YZ plane) overlaps the laser light exit surface SF.

When seen in the X axis, the diffraction grating layer 4 is equipped with a diffraction grating forming region RPC. In the diffraction grating forming region RPC, the refractive index periodically changes within the YZ plane. When seen in the X axis, the diffraction grating forming region RPC is set wider than the region where the active layer is formed. This is done in order for the diffraction grating forming region RPC to always exist in the region involved with light propagation including the active layer 3B.

When the above-mentioned semiconductor laser element is seen in the X axis, a margin region free of the light-emitting layer 3 including the active layer 3B exists on the outside of the upper electrode E2. The margin region also functions to suppress the reflection on the end faces of the active layer 3B and within a base layer 4A and thus can be referred to as an end face reflection suppressing region.

While the end face reflection suppressing region located on the outside of the area directly under the upper electrode E2 is free of the quantum well layer as the active layer 3B in principle, no laser resonance will occur even if the quantum well layer exists within the end face reflection suppressing region unless a current (carrier) is injected in this region when the upper electrode E2 is constructed as mentioned above. With respect to light at the laser resonance wavelength, the end face reflection suppressing region has no gain and suppresses absorption.

Figure 3:
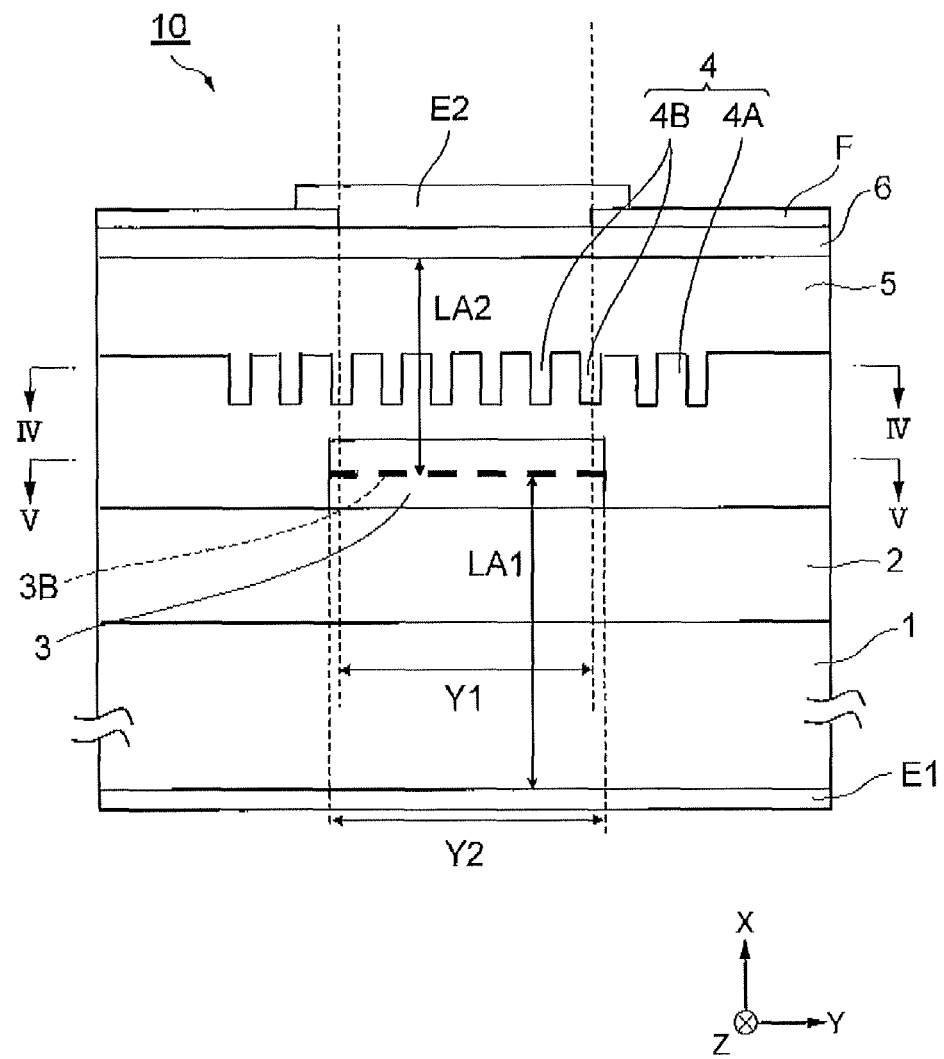
FIG. 3 is a vertical sectional view taken along the line III-III of the semiconductor laser element.

FIG. 3 is a vertical sectional view taken along the line III-III of the semiconductor laser element.

The diffraction grating layer 4 is in contact with the light-emitting layer 3 on its upper electrode B2 side and side faces. The diffraction grating layer 4 comprises a base layer 4A made of a semiconductor material and a plurality of different refractive index parts 4B, periodically located within the base layer 4A, having a refractive index different from that of the base layer 4A. While light is scattered at a boundary between such materials having refractive indexes different from each other, periodically arranging scatterers enables specific wavelength light components to enhance each other, so as to form a standing wave state, thereby resonating within the diffraction grating layer 4B.

When a drive current flows between the upper and lower electrodes E2, E1, carrier recombination occurs in the active layer 3B, thereby emitting light. When thus generated light passes through the active layer while in a state where a population inversion is formed by injecting carriers into the active layer 3B, stimulated emission occurs, thereby producing laser light. Here, the Fabry-Perot mode occurring between the laser light exit surface SF and the opposite end face SB is suppressed. That is, as FIG. 2 illustrates, the upper electrode E2 is separated from the opposite end face 3B by the distance ZB1, so that no carriers are injected into the gap therebetween, whereby no laser light occurs there. Hence, the Fabry-Perot mode occurring between the laser light exit surface SF and the opposite end face SB is suppressed.

Since the upper electrode E2 is separated from the lateral end faces by the distances YR1, YL1 as FIG. 2 illustrates, no carriers are injected into the active layer corresponding to thus formed gaps, whereby no laser light occurs there. This restrains the laser light of the Fabry-Perot mode from occurring between the lateral end faces SR, SL.

Letting Y1 be the size of the upper electrode E2 in the width direction and Y2 be the size of the active layer 3B (light-emitting layer 3) in the width direction, $Y1 \leq Y2$. When seen in the Y axis, as FIG. 2 illustrates, the active layer 3B (light-emitting layer 3) and the opposite end face SB are separated from each other by the distance ZB2, while the active layer 3B (light-emitting layer 3) is separated from both lateral end faces SR, SL by the distances YR2, YL2, respectively. Within the YZ plane including the active layer 3B (light-emitting layer 3), the active layer 3B (light-emitting layer 3) is in contact with the semiconductor material (base layer 4A) except for the laser light exit surface SF. The semiconductor material (base layer 4A) has an energy bandgap wider than that of the well layers 3B2, 3B4 (see FIG. 6) constituting the active layer.

In the above-mentioned structure, each end face of the semiconductor laser element is separated from the upper electrode E2, so as to suppress the carrier injection in thus formed gaps, while each end face is separated from the active layer 3B, so as to suppress the carrier recombination itself in thus formed gaps, thereby restraining the Fabry-Perot mode caused by reflection between the end faces, so that the laser light generation mode dependent on the diffraction grating layer becomes dominant.

Since a part of the light generated by the carrier recombination in the active layer 3B also exists within the diffraction grating layer 4, a specific wavelength component is selectively enhanced by a diffraction effect due to the diffraction grating layer 4, whereby a two-dimensional standing wave state is formed within the YZ plane. The two-dimensional standing wave state acts as a resonator for confining light, so as to provide the active layer with a sufficient gain, thereby generating laser oscillation. A part of thus laser-oscillated light is emitted from the laser light exit surface SF. The following is a principle by which the mode dependent on the diffraction grating layer is generated instead of the Fabry-Perot mode.

The lower electrode E1 is separated from the active layer 3B by a distance LA1 which is at least 100 μm, while the upper electrode E2 is separated from the active layer 3B by a distance LA2 which is shorter than the distance LA1, i.e., several μm. This can selectively drive only the vicinity of a part corresponding to the upper electrode E2 (region directly under the upper electrode) in the active layer 3B. A portion of the light generated in the part corresponding to the upper electrode E2 in the active layer 3B also exists in the diffraction grating layer 4. Therefore, the light of the active layer 3B receives two-dimensional feedback from the diffraction grating layer 4, so as to form a standing wave state over a large area. Injecting a sufficient current causes the standing wave state to oscillate, thereby achieving single-mode oscillation over a large area within the YZ plane. A part of thus oscillated light is taken out as a laser light output in the +Z direction. Here, appropriately setting the feedback effect obtained by the diffraction grating layer 4 and the electrode size can attain a single transverse and longitudinal mode in the whole region of the upper electrode E2, whereby the laser light exit surface yields a laser light output to become a broad area in the single transverse and longitudinal mode.

The end face reflection suppressing region acts to feed back the light leaking from the upper electrode E2 to the upper electrode region side but does not absorb this light. Hence, it can attain low-loss, highly efficient single-mode oscillation, while inhibiting the Fabry-Perot mode from being formed between the light output end face and its opposite end face in the −Z direction.

A square is employed as the form of the upper electrode E2 in the foregoing. A rotationally symmetrical distribution can be expected as a transverse mode distribution of the fundamental mode of the laser light. Therefore, the ratio of light cast on the light reflection suppressing region is expected to become smaller as the form of the upper electrode is nearer to a square or true circle. Since this embodiment uses a light absorption region as the light reflection suppressing region, the loss in the mode resulting from the two-dimensional photonic crystal is expected to decrease as the ratio of light cast on the light reflection suppressing region is smaller.

Figure 4:
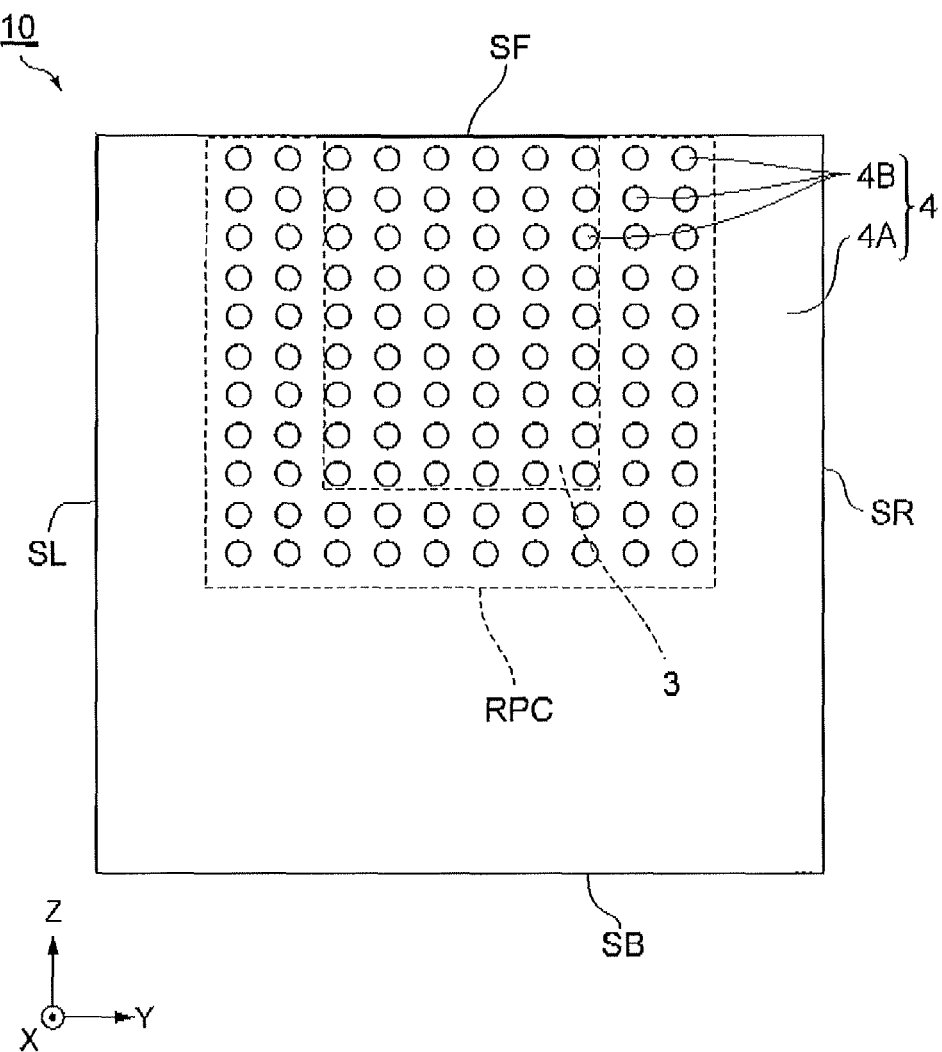
FIG. 4 is a horizontal sectional view taken along the line IV-IV of the semiconductor laser element.

FIG. 4 is a horizontal sectional view taken along the line IV-IV of the semiconductor laser element depicted in FIG. 3.

Within the diffraction grating forming region RPC in the diffraction grating layer 4, a plurality of different refractive index parts 4B are embedded in the base layer 4A. The different refractive index parts 4B are aligned in the Y and Z axes, so as to form a square lattice within the YZ plane, thereby extending two-dimensionally. Each of the different refractive index parts 4B has a depth of 100 nm to 200 nm within the base layer 4A and a substantially circular two-dimensional form within the YZ plane with an average diameter of 100 nm to 150 nm. The different refractive index parts 4B have a period of 300 nm in each of the Y and Z axes. The two-dimensional form of the different refractive index part 4B within the YZ plane is not limited to circles, but may be any of polygons such as triangles, quadrangles, pentagons, and hexagons. As a two-dimensional extension, the center of gravity of each different refractive index part 4B may constitute a lattice point in a triangular lattice instead of the square lattice within the YZ plane, While the form mentioned above illustrates an example in an oscillation state in which one wavelength is included between lattice points at an oscillation wavelength of 980 nm, i.e., so-called r-point oscillation, it can similarly deal with other oscillation wavelengths by enlarging or reducing the periodic structure in proportion to the oscillation wavelength and enables oscillation at other highly symmetrical points such as a point called M point (mentioned in Non Patent Literature 2) in the band structure, for example, other than the Γ' point.

Thus constructed semiconductor laser element can emit laser light along the Z axis from its end face.

Figure 5:
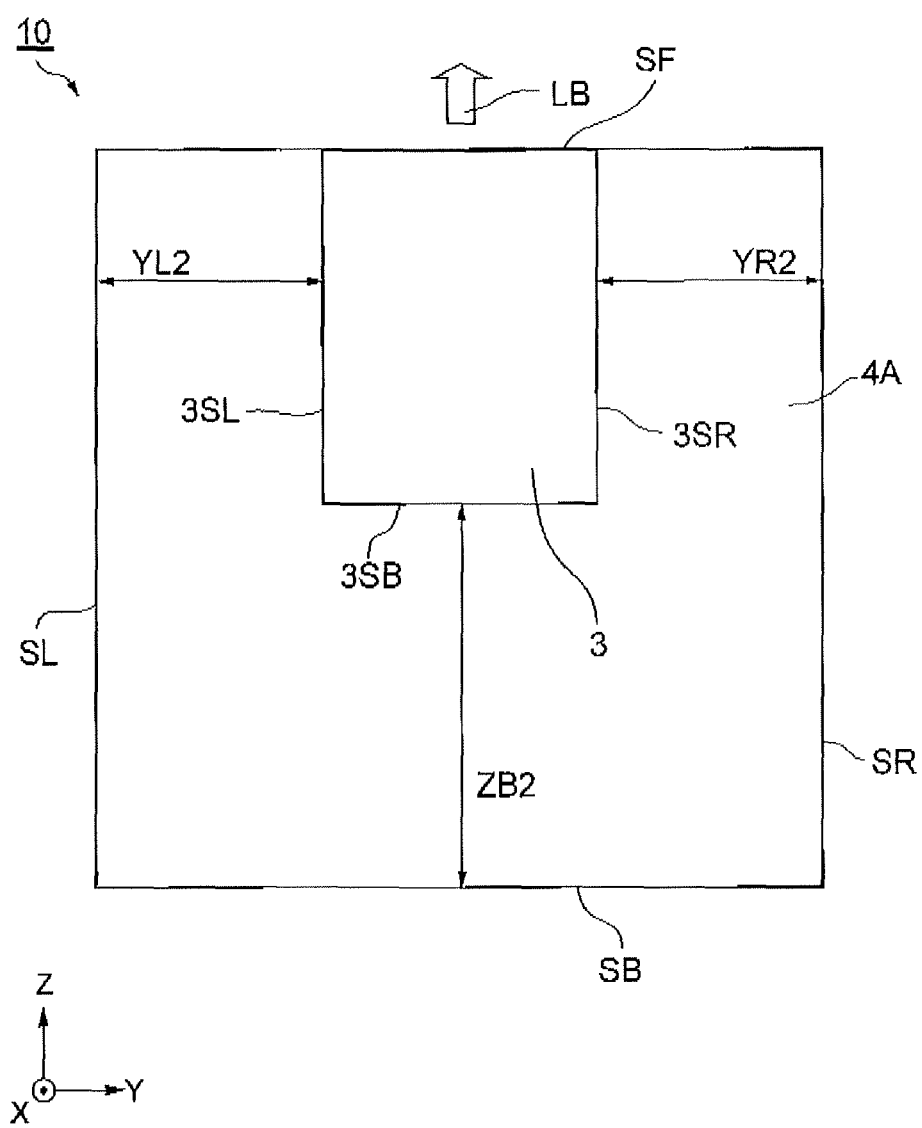
FIG. 5 is a horizontal sectional view taken along the line V-V of the semiconductor laser element.

FIG. 5 is a horizontal sectional view taken along the line V-V of the semiconductor laser element depicted in FIG. 3.

Within the YZ plane, the active layer 3B (light-emitting layer 3) has four end faces SF, 3SR, 3SF, 3SB about the X axis. The end face SF is the laser exit surface, the end faces 3SR, 3SF are lateral end faces, and the end face 3SB is the opposite end face opposing the laser light exit surface. Within the YZ plane including the active layer 3B, the semiconductor material constituted by the base layer 4A of the diffraction grating layer 4 is in contact with the end faces 3SR, 3SF, 3SB of the active layer 3B (light-emitting layer 3) other than the light exit surface SF.

The refractive index difference between the active layer 3B (light-emitting layer) and the base layer 4A is smaller than that in the case where the active layer 3B is in contact with air. The reflectance becomes higher as the refractive index is greater. Hence, the reflectance at the end faces of the active layer 3B becomes lower than that in the case where it is in contact with air, thereby suppressing end-face reflection. This inhibits laser light of the Fabry-Perot mode from being generated by the end-face reflection between the active layer 3B and the base layer 4A.

The semiconductor material (base layer 4A) in contact with the end faces of the active layer 3B (light-emitting layer 3) has an energy bandgap wider than the energy bandgap corresponding to the laser resonance wavelength λ of the Fabry-Perot mode resonating along the Z axis within the active layer. In this case, the semiconductor material is transparent to laser light at the laser resonance wavelength. Hence, the absorption and reflection within the base layer 4A made of the semiconductor material are suppressed. The laser resonance wavelength roughly corresponds to the energy bandgap for well layers in the active layer. In general, wavelength λ (nm) and energy bandgap Eg (eV) have the relationship of λ=1240/Eg therebetween and thus are in inverse proportion to each other. That is, when the energy bandgap of a semiconductor material constituting the base layer 4A is wider than that of the well layers, the absorption and reflection within the semiconductor material can be suppressed.

As for the transparency of the semiconductor material, the laser resonance wavelength has a wavelength component corresponding to an energy bandgap slightly wider than that at a band end of the well layers 3B2, 3B4 (see FIG. 6).

As in the foregoing, a simple structure in which a partial region of the base layer 4A constituting the diffraction grating layer 4 is brought as the above-mentioned semiconductor material into contact with an end face of the active layer 3B can form a structure for suppressing the above-mentioned Fabry-Perot mode. In this case, as mentioned above, the end faces of the active layer are in contact with the semiconductor material (base layer 4A), so that the refractive index difference between the active layer 3B (light-emitting layer 3) and the semiconductor material (base layer 4A) is smaller than that obtained in contact with air, and the fact that the semiconductor material has a wide energy bandgap can restrain the absorption and reflection within the semiconductor material, whereby the Fabry-Perot mode is further suppressed. Here, the refractive index means the average refractive index within a subject region involved with light propagation.

FIG. 6 is a diagram illustrating the semiconductor material (base layer 4A) in contact with the active layer 3B (light-emitting layer 3).

This drawing illustrates the base layer 4A in contact with the active layer 3B (light-emitting layer 3) in the +Y, −Y, or −Z direction.

The light-emitting layer 3 is constructed by stacking the guide layer 3A, active layer 3B, spacer layer 3C, carrier block layer 3D, and guide layer 3E in sequence. These compound semiconductor layers contain compounds based on AlGaAs. Changing the Al composition ratio in AlGaAs can easily alter the energy bandgap and refractive index. Lowering the composition ratio X of Al having a relatively small atomic radius in $Al_XGa_{1-X}As$ reduces the energy bandgap positively correlated therewith, and mixing GaAs with In having a large atomic radius so as to yield InGaAs further reduces the energy bandgap.

In the carrier block layer 3D (X=0.4) for enhancing the energy barrier so as to confine carriers into the active layer 3B, the composition ratio X of Al is made greater than that in each of the spacer layer 3C (X=0.1), the guide layers 3A, 3E (X=0.1), and the barrier layers 3B1, 3B3, 3B5 (X=0.1) in the active layer 3B, so as to enhance the energy bandgap.

The well layers 3B2, 3B4 constituted by InGaAs, which are interposed between the barrier layers 3B1, 3B3, 3B5 (X=0.1) in the active layer 3B of $Al_XGa_{1-X}As$, have no Al composition ratio X but contain In, so as to exhibit an energy bandgap smaller than that of the barrier layers 3B1, 3B3, 3B5. The lower and upper cladding layers 2, 5 have Al composition ratios X (X=0.7 and X=0.4) each greater than the Al composition ratio X of the guide layers, thereby yielding relatively wider energy bandgaps and lower refractive indexes than the latter. In general, the energy bandgap and the refractive index are negatively correlated with each other.

At a wavelength of 0.9 μm, the refractive index of the base layer 4A (AlGaAs) falls between the refractive index of GaAs (3.59) and the refractive index of AlAs (2.97) and is higher than the refractive index of air (=1) regardless of its Al composition ratio. Since the reflectance depends on the refractive index difference, the refractive index difference (i.e., reflectance) between the active layer 3B (light-emitting layer 3) and the base layer 4A is smaller than the refractive index difference (i.e., reflectance) between the active layer 3B (light-emitting layer 3) and air. Here, the refractive index of the active layer 3B (light-emitting layer 3) is its average refractive index.

Within the light-emitting layer 3, the majority of layers are made of $Al_XGa_{1-X}As$ whose Al composition X=0.1, while their adjacent base layer 4A is also made of $Al_XGa_{1-X}As$ whose Al composition X=0.1, whereby reflection is remarkably suppressed at their boundary. While a slight refractive index difference exists between the base layer 4A made of InGaAs and the well layers 3B2, 3B4 made of AlGaAs and thus yields some reflection at their boundaries, these layers are so thin that the amount of boundary reflection is small in total. When, the base layer 4A has a refractive index on a par with or higher than (i.e., an Al composition ratio equal to or smaller than) that of the barrier layers 3B1, 3B3, 3B5, the boundary reflection is sufficiently suppressed.

As in the foregoing, the end-face-emitting photonic crystal laser element in accordance with this embodiment suppresses the Fabry-Perot mode, so that the mode dependent on the diffraction grating layer becomes relatively dominant, whereby the laser light is emitted stably.

FIG. 7 is a chart illustrating a specific example of semiconductor layer structures of the semiconductor laser element.

The lower cladding layer 2, guide layer 3A, active layer 3B, spacer layer 3C, carrier block layer 3D, diffraction grating layer 4, upper cladding layer 5, and contact layer 6 are sequentially stacked on the semiconductor substrate 1. The semiconductor substrate 1 is n-type GaAs, the lower cladding layer 2 is n-type $Al_XGa_{1-X}As$ (X=0.7), the guide layer 3A is $Al_XGa_{1-X}As$ (X=0.1), the active layer 3B is a quantum well layer made of $Al_XGa_{1-X}As$ (X=0.1)/InGaAs, the spacer layer 3C is GaAs, the carrier block layer 3D is $Al_XGa_{1-X}As$ (X=0.4), the diffraction grating layer 4 comprises the base layer 4A made of GaAs and the different refractive index parts made of $Al_XGa_{1-X}As$ (X=0.4), the upper cladding layer 5 is $Al_XGa_{1-X}As$ (X=0.4), and the contact layer 6 is p-type GaAs.

Except for the contact layer 6 and cladding layers 2, 5, the compound semiconductor layers are essentially nondoped ones without impurities added thereto, i.e., each of the guide layer 3A, active layer 3B, spacer layer 3C, carrier block layer 3D, and diffraction grating layer 4 has an impurity concentration of $1\times10^{16}/cm^3$ or less. The contact layer 6 may have an impurity concentration of $1\times10^{19}/cm^3$ or more, while the cladding layers 2, 5 may have an impurity concentration of $1\times10^{17}/cm^3$ or more, for example. The compound semiconductor layers between the cladding layers are not doped with impurities in order to construct a p-n junction diode laser but may be slightly doped therewith, so as to make the guide layer somewhat n-type and the spacer layer 3C, carrier block layer 3D, and diffraction grating layer 4 somewhat p-type. Si, Se, and the like may be used as n-type impurities, while Zn, Mg, and the like may be used as p-type impurities.

The lower cladding layer 2, guide layer 3A, active layer 3B, spacer layer 3C, carrier block layer 3D, diffraction grating layer 4, upper cladding layer 5, and contact layer 6 may have thicknesses of 1.0 to 3.0 μm, 0 to 300 nm, 10 to 100 nm, 10 to 200 nm, 50 to 200 nm, 50 to 200 nm, 1.0 to 3.0 μm, and 50 to 500 nm, respectively. The number of well layers in the multiple quantum well layer constituting the active layer 3B, which is 2 in the above-mentioned example, may also be 1 or 3 or greater. The present invention is also applicable to the semiconductor laser element having the above-mentioned semiconductor layer structure.

Figure 8:
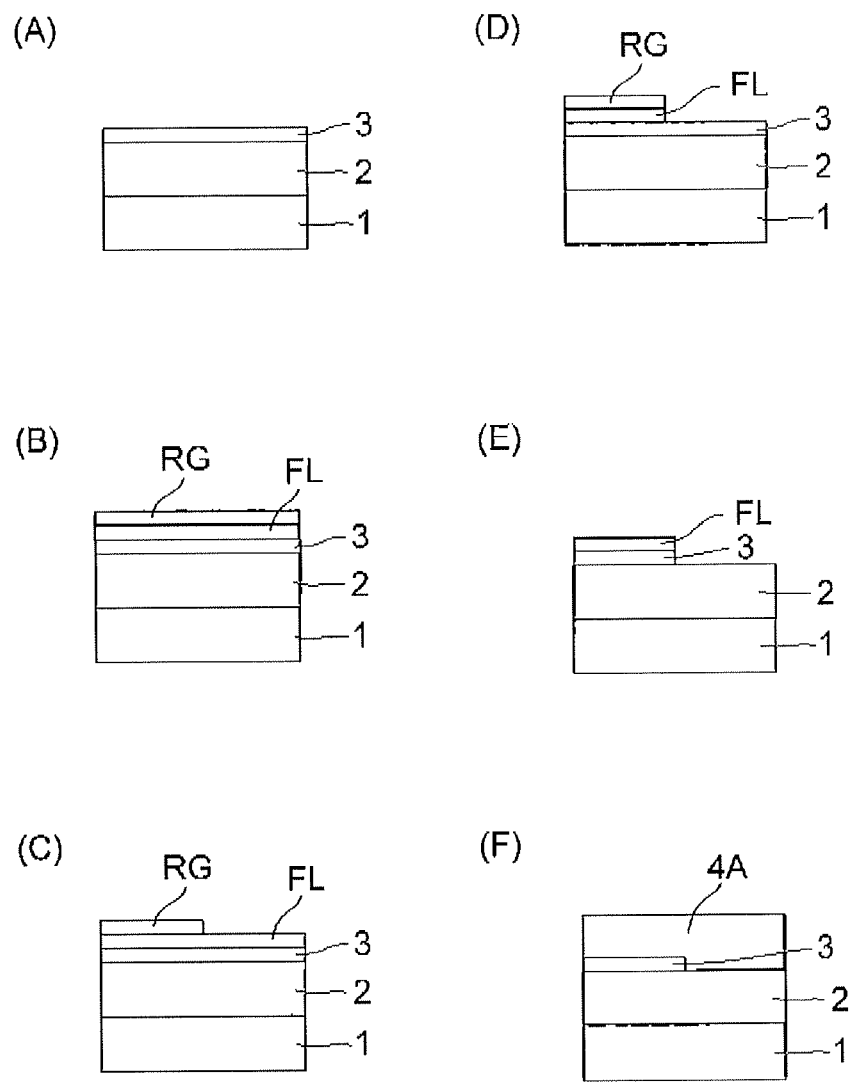
Figure 9:
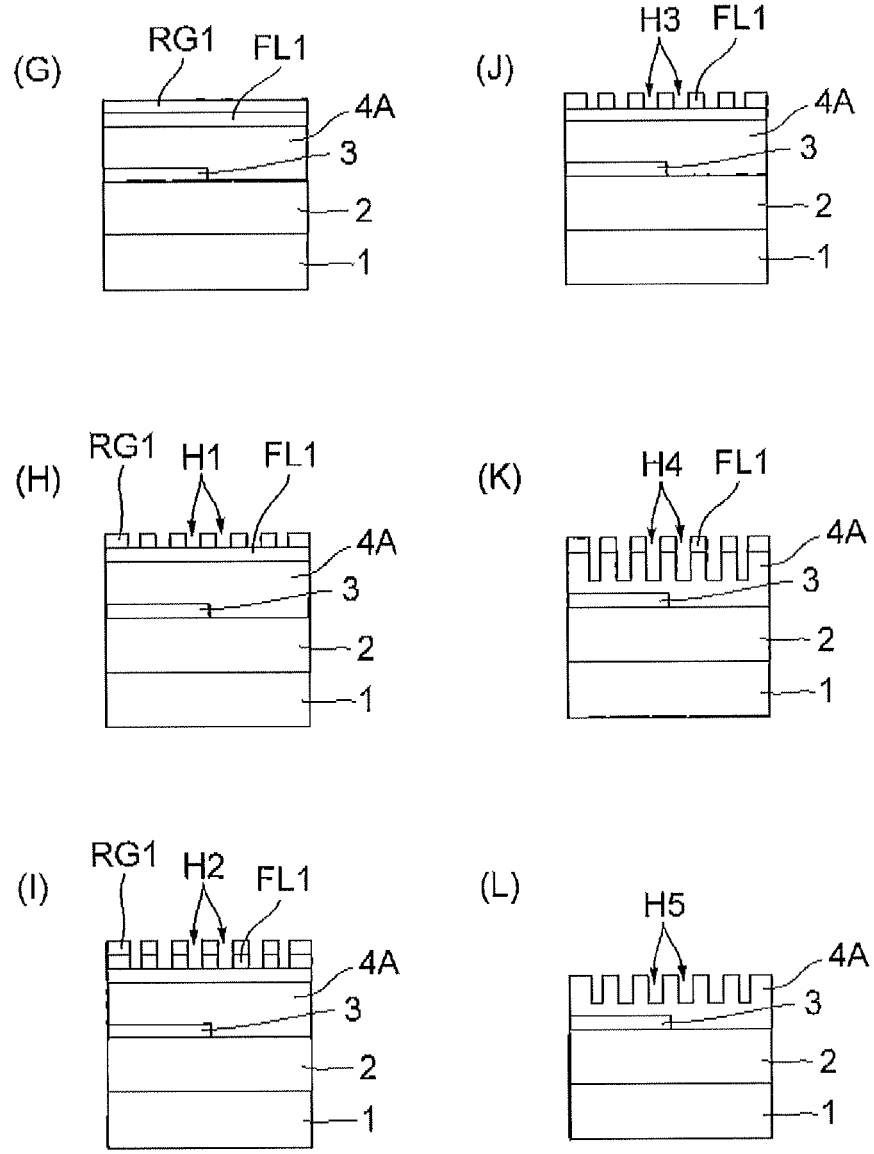

FIGS. 8 and 9 are diagrams illustrating a method for manufacturing the above-mentioned semiconductor laser element.

For forming each of the compound semiconductor layers constituting the semiconductor laser element, metal organic chemical vapor deposition (MOCVD) may be used. The MOCVD may employ TMA (trimethylaluminum), TMG (trimethylgallium), and TMI (trimethylindium) as aluminum, gallium, and indium materials, respectively, and adjust composition ratios of the compound semiconductors by controlling ratios of material gases. In the following explanation, the composition ratios in the compound semiconductor layers are set as appropriate by changing partial pressures of the material gases.

Simultaneously with growing the compound semiconductor layers, gases containing p- or n-type impurities may be added. Examples of materials containing p-type impurities (Zn and Mg) include dimethylzinc (DMZn) and bis(cyclopentadienyl)magnesium ($Cp_2Mg$), while examples of materials containing n-type impurities (Si and Se) include Si and $H_2Se$.

First, an n-type (first conduction type) semiconductor substrate (GaAs) 1 is prepared. Subsequently, an n-type lower cladding layer (AlGaAs) 2 and a light-emitting layer 3 are epitaxially grown in sequence by the MOCVD on the semiconductor substrate 1 (FIG. 8(A)). The light-emitting layer 3 is formed by sequentially stacking compound semiconductor layers 3A, 3B, 3C, 3D, 3E. While the semiconductor layers 3A, 3C, 3D, 3E are made of AlGaAs, the active layer 3B has a multilayer structure of AlGaAs and InGaAs and thus is formed by alternately stacking AlGaAs and InGaAs.

Next, the light-emitting layer 3 including the active layer 3B is etched into the form illustrated in FIG. 5 (FIGS. 8(B) to 8(E)). That is, an insulating layer FL made of SiN is formed by plasma CVD on the surface of the light-emitting layer 3, and a resist RG is applied thereon (FIG. 8(B)) and thereafter exposed to light, patterned, and developed, so as to form a resist mask layer (FIG. 8(C)). As for a material gas of the plasma CVD for forming SiN, $SiH_4$ is used as an Si material, $N_2$, $NH_3$, or the like is used as an N material, and the gas is diluted with $H_2$ or Ar when necessary. Etching through thus obtained mask layer can form a mask layer constituted by the insulating layer FL (FIG. 8(D)). In general, fluorine-based gases ($CF_4$, $CHF_3$, and $C_2H_6$) can be used as an etching gas for SiN.

The resist RG is removed by ashing, and then the light-emitting layer 3 is etched through the mask layer of the insulating layer FL, so as to leave the light-emitting layer 3 having the form illustrated in FIG. 5 on the lower cladding layer 2 (FIG. 8(E)). As the ashing, photo-excited ashing or plasma ashing may be used. The two-dimensional form of this mask layer is rectangular, extending along the Z axis from the laser light exit surface SF to a position falling short of the opposite end face SB and along the Y axis from the center in the width direction of the element to positions falling short of the lateral end faces SR, SF.

Dry etching is used for etching the light-emitting layer 3. The dry etching may employ a chlorine- or fluorine-based gas as an etching gas. For example, an etching gas mainly composed of $Cl_2$, $SiCl_4$, $SF_6$, or the like mixed with an Ar gas or the like may be used. In addition to typical plasma etching, one using electron cyclotron resonance (ECR) is employable.

Subsequently, a base layer 4A constituted by AlGaAs is grown on the remaining light-emitting layer 3 and the exposed lower cladding layer 2, so as to cover the upper face and side faces of the light-emitting layer 3 (FIG. 8(F)).

Next, a mask layer FL1 made of SiN is formed by plasma CVD on the base layer 4A (FIG. 9(G)). As a material gas of the plasma CVD for forming SiN, $SiH_4$ is used as an Si material, $N_2$, $NH_3$, or the like is used as an N material, and the gas is diluted with $H_2$ or Ar when necessary. Further, a resist RG1 is applied onto the mask layer FL1, and a fine two-dimensional pattern is drawn thereon by an electron beam lithography system and developed, so as to form a fine two-dimensional (or one-dimensional) pattern (corresponding to the positions of different refractive index parts) in the resist RG1 (FIG. 9(H)). This forms a plurality of holes H1 constituting a fine pattern in the resist RG1, while each hole H1 reaches the surface of the mask layer FL1.

Subsequently, the mask layer FL1 is etched through the resist RG1 used as a mask, so as to transfer the fine pattern of the resist to the mask layer FL1 (FIG. 9(I)). Reactive ion etching (RIE) may be used for the etching. In general, fluorine-based gases ($CF_4$, $CHF_3$, and $C_2H_6$) may be used as an etching gas for SiN. This etching forms holes H2 in the mask layer FL1, while each hole H2 reaches the surface of the base layer 4A.

Then, the resist RG1 is supplied with a peeling solution and ashed, so as to be removed (FIG. 9(J)). As the ashing, photo-excited ashing or plasma ashing may be used. This leaves the mask layer FL1 having a fine pattern with a plurality of holes 113 alone on the base layer 4A.

Thereafter, the base layer 4A is etched through the mask layer FL 1 used as a mask, so as to transfer the fine pattern of the mask layer FL1 to the base layer 4A (FIG. 9(K)). Dry etching is used for the etching. The dry etching may employ a chlorine- or fluorine-based gas as an etching gas. For example, an etching gas mainly composed of $Cl_2$, $SiCl_4$, $SF_6$, or the like mixed with an Ar gas or the like may be used. In addition to typical plasma etching, one using electron cyclotron resonance (ECR) is employable. This etching forms holes H4 having a depth of about 200 nm, which is smaller than the thickness of the base layer 4A, in the base layer 4A. The holes H4 may reach the surface of the semiconductor layer serving as a foundation for the base layer 4A.

Next, reaction ion etching (RIB) removes only the mask layer made of SiN, so as to expose the open end faces of holes H5 continuous with the holes H4, i.e., expose the surface of the base layer 4A (FIG. 9(L)). As mentioned above, fluorine-based gases ($CF_4$, $CHF_3$, and $C_2H_6$) may be used as an etching gas for SiN. Thereafter, the base layer 4A is subjected to surface processing such as surface washing including thermal cleaning.

Subsequently, using MOCVD, different refractive index parts (embedded layers 4B) are formed (regrown) within the holes H5 of the base layer 4A (FIG. 10(M)). This regrowing step supplies AlGaAs to the surface of the base layer 4A. Thus supplied AlGaAs has an Al composition ratio higher than that of the base layer 4A. At the initial stage of regrowing, AlGaAs fills the holes H5, so as to form the different refractive index parts 4B. The AlGaAs supplied after filling the holes H5 piles up as a buffer layer on the base layer 4A. Thereafter, a p-type (second conduction type) cladding layer (AlGaAs) 5 and a p-type contact layer (GaAs) 6 are grown in sequence by MOCVD on the diffraction grating layer 4 (FIG. 10(N)). The Al composition ratio X in the p-type cladding layer (AlGaAs) 5, which is not smaller than that in the different refractive index parts 4B, equals thereto in this example, and X=0.4 may be employed. Of course, for example, the Al composition ratio X may be X=0.35 in the different refractive index parts 4B and buffer layer and gradually increase with growth, so that X=0.4 in the upper cladding layer 5. Here, all of the crystal growths mentioned above are epitaxial growths, so that the semiconductor layers have the same crystal axis.

Figure 10:
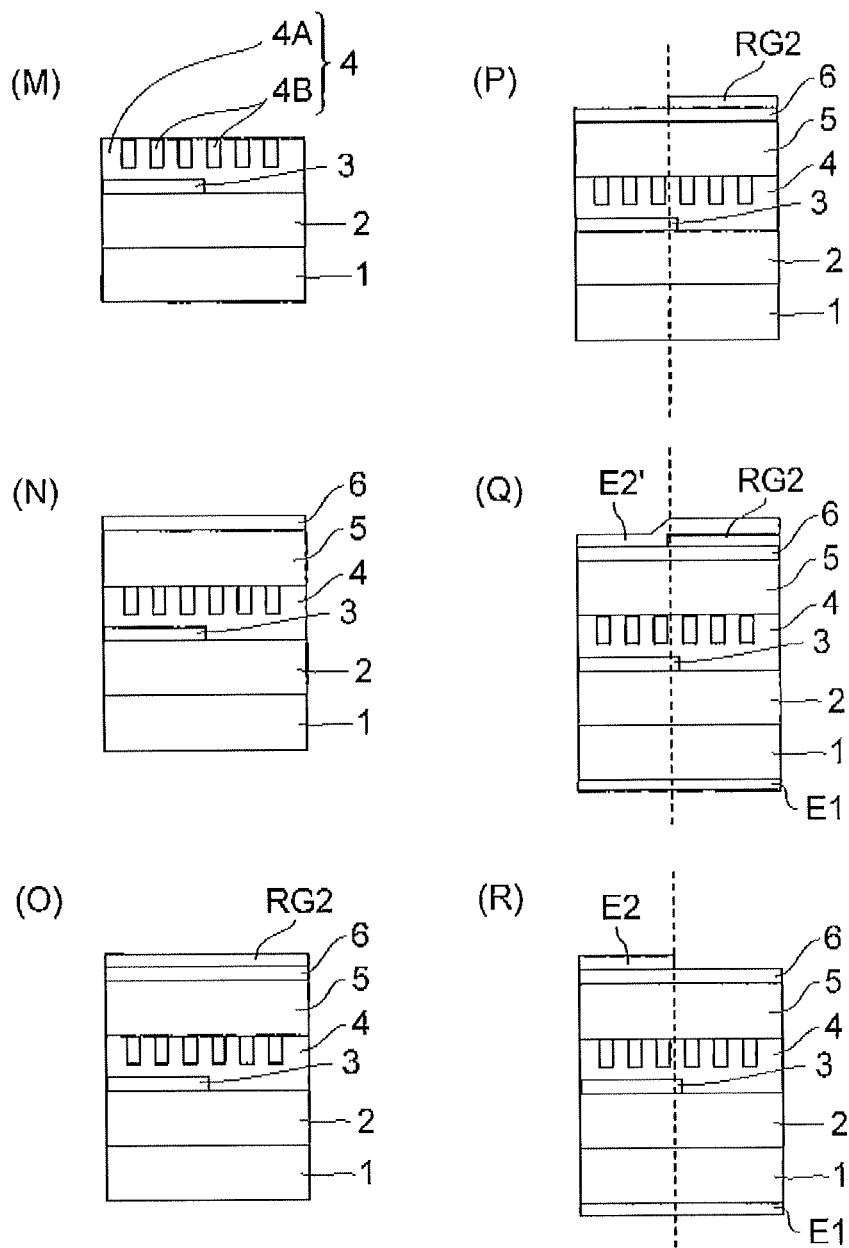

Next, a resist RG2 is applied onto the contact layer 6 (FIG. 10(O)). This resist RG2 is exposed to light through such a pattern as to form a rectangular slot opening extending from the laser light exit surface after development processing. That is, a positive resist having a rectangular exposure region with one side coinciding with the laser light exit surface is exposed to light, or a region surrounding a negative resist having a rectangular non-exposure region with one side coinciding with the laser light exit surface is exposed to light. Thereafter, the resist RG2 is subjected to development processing, so as to form a rectangular slot opening pattern having the laser light exit surface as one side at an end part of the resist RG2 (FIG. 10(P)). While the resist RG2 having the opening pattern is used as a mask, an electrode material E2' is deposited on the resist RG2 and the exposed surface of the contact layer 6 (FIG. 10(Q)). While vapor deposition, or sputtering may be used for forming this electrode material, vapor deposition is used in this example.

Further, the resist RG2 is removed by liftoff, so as to leave the electrode material in a rectangular form on the contact layer 6, thereby forming an upper electrode E2 (FIG. 10(R)). Thereafter, the rear face of the n-type semiconductor substrate 1 is polished, and a lower electrode E2 is subsequently formed all over the polished rear face. Vapor deposition or sputtering may be used for forming this electrode. The length along the Z axis of the upper electrode E2, which is substantially the same as that of the light-emitting layer 3, may be exactly the same as that of the latter, but the light-emitting layer 3 is slightly longer in this example. Here, an insulating layer F having an opening pattern may be formed on the contact layer 6, and the upper electrode E2 may be patterned within a region including the opening. This opening pattern is a rectangle, whose one side overlaps the light exit end face seen as a line in the X axis.

While a groove for separating a plurality of semiconductor laser elements is required to be formed when such elements are manufactured from one wafer, a resist is applied onto the contact layer 6, exposed to light, and developed, so as to form an opening pattern for separating elements, and the contact layer 6 is wet-etched through this resist, so as to form the groove. The depth of etching is about 10 µm. Thereafter, the resist may be removed by an organic solvent.

While a method based on electron beam exposure is explained as one for making the holes H1 in the embodiment, other fine processing techniques such as nanoimprinting, interference exposure, focused ion beam (FIB), and optical exposure using a stepper may also be used. While an example in which one diffraction grating layer 4 is provided on the upper side of the active layer 3B is explained above, a diffraction grating layer may be provided on the lower side of the active layer 3B, or respective diffraction grating layers may be provided on the upper and lower sides of the active layer 3B.

The active layer 3B has a rectangular form within the YZ plane in the above but may have other forms.

Figure 11:
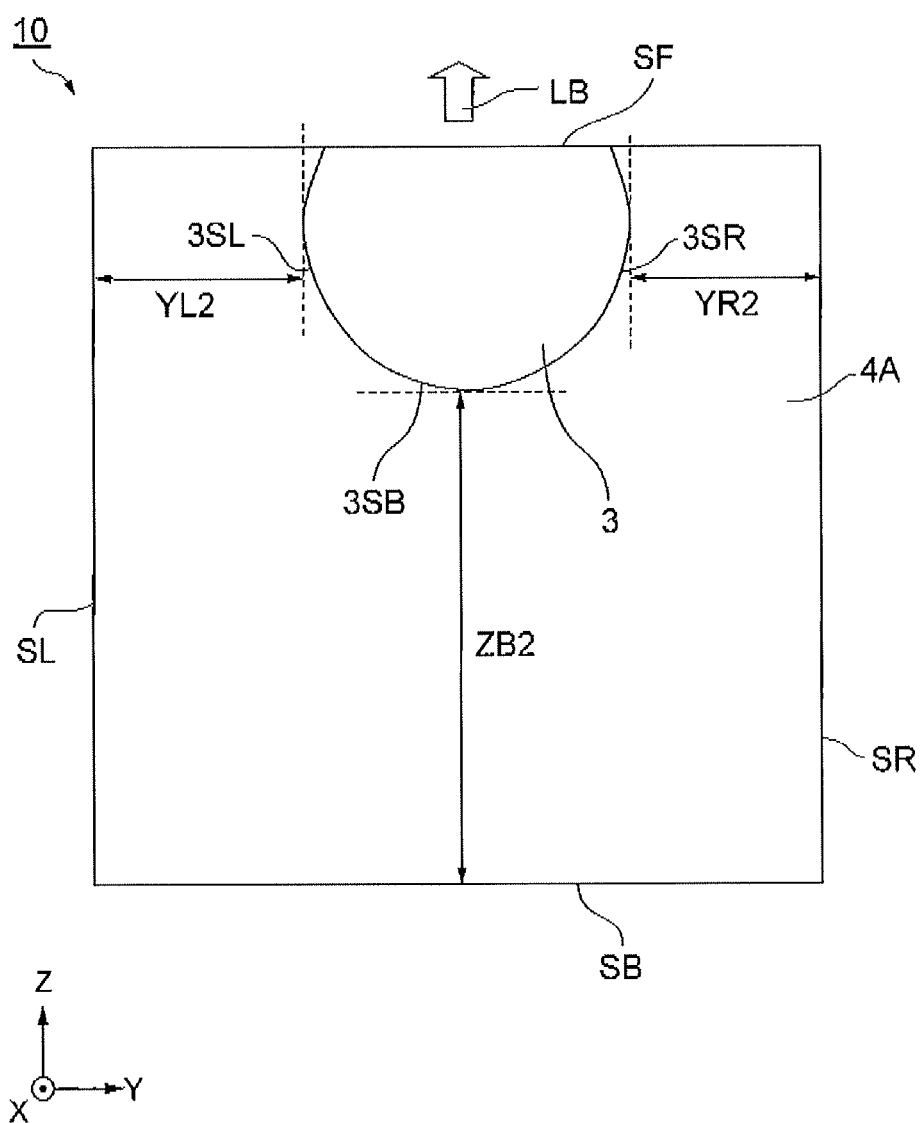
FIG. 11 is a diagram illustrating a modified example of the horizontal cross section of the semiconductor laser element depicted in FIG. 5.

FIG. 11 is a diagram illustrating a modified example of the horizontal cross section of the semiconductor laser element depicted in FIG. 5. It differs from the one depicted in FIG. 5 in that the active layer 3B (light-emitting layer 3) is not shaped into a rectangle but a partly cut-off circle within the YZ plane. This form is produced by cutting a circle with a line parallel to a line passing the center of gravity of the circle and superposing the former line and the laser light exit surface SF on each other within the YZ plane. This form becomes a semicircle when the cut position passes the center of gravity of the circle. The shortest distances ZB2, YR2, YL2 between the active layer 3B (light-emitting layer 3) and the three end faces SB, SR, SL of the semiconductor laser element for sufficiently suppressing end-face reflection are at least 50 µm each.

Figure 12:
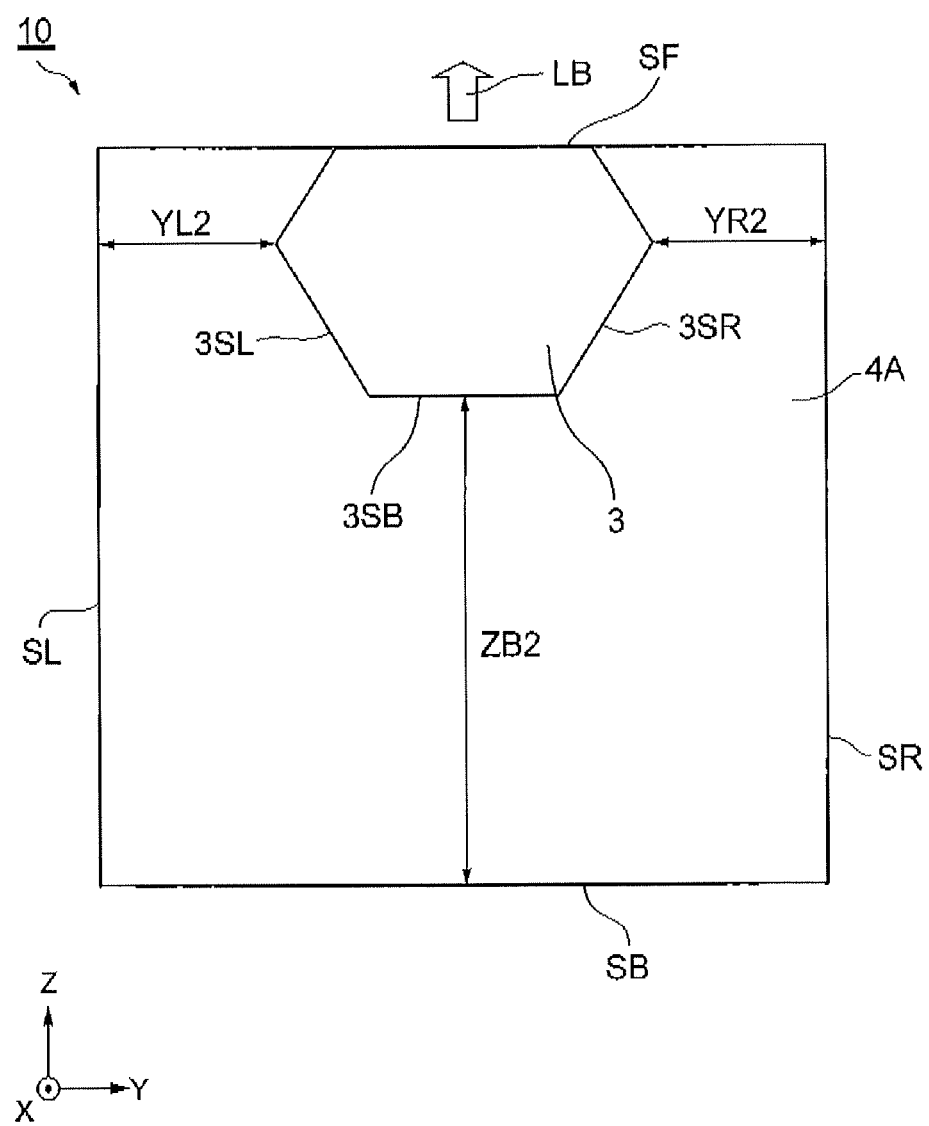
FIG. 12 is a diagram illustrating another modified example of the horizontal cross section of the semiconductor laser element depicted in FIG. 5.

FIG. 12 is a diagram illustrating another modified example of the horizontal cross section of the semiconductor laser element depicted in FIG. 5. It differs from the one depicted in FIG. 5 in that the active layer 3B (light-emitting layer 3) is not shaped into a rectangle but a partly cut-off hexagon within the YZ plane. This form is produced by cutting a regular hexagon with a line parallel to a line passing the center of gravity of the hexagon and two vertices thereof and superposing the former line and the laser light exit surface SF on each, other within the YZ plane. The cut position may pass the center of gravity of the hexagon. The shortest distances ZB2, YR2, YL2 between the active layer 3B (light-emitting layer 3) and the three end faces SB, SR, SL of the semiconductor laser element for sufficiently suppressing end-face reflection are at least 50 µm each.

Figure 13:
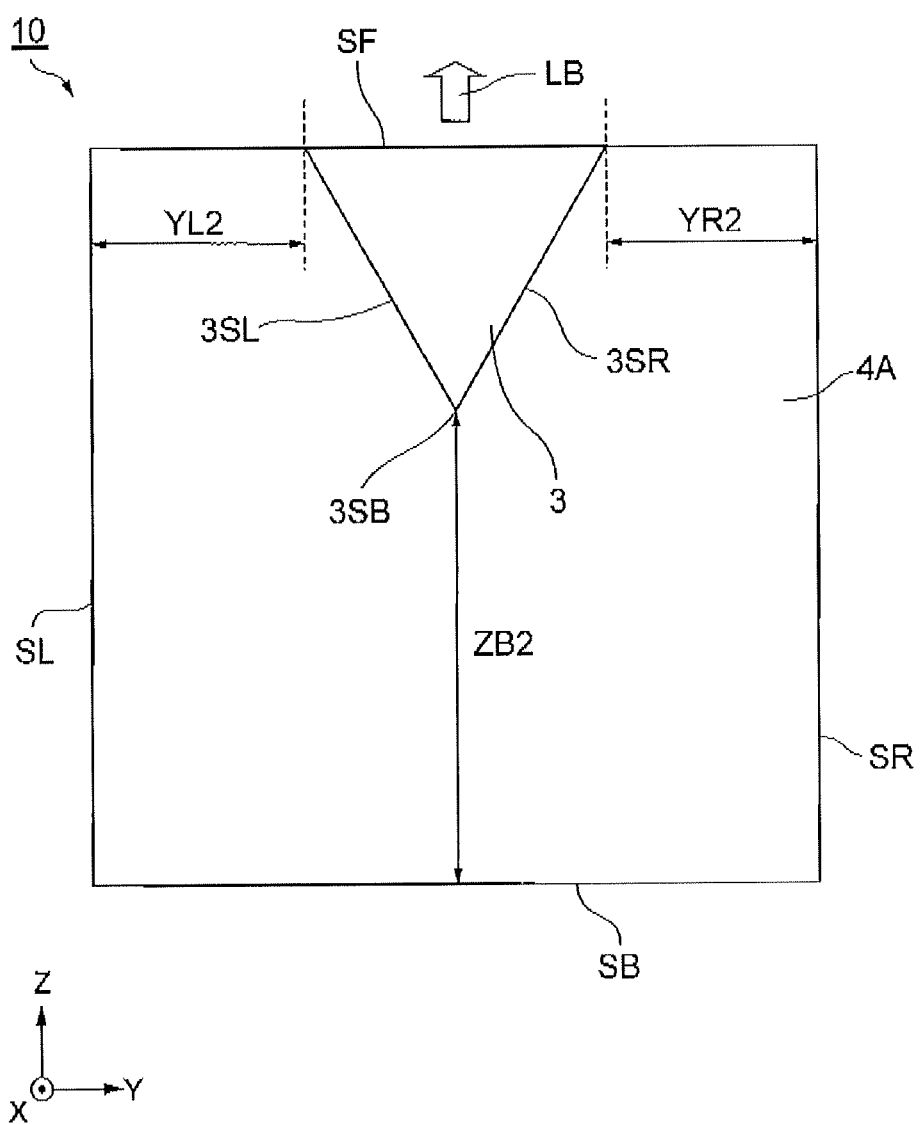
FIG. 13 is a diagram illustrating still another modified example of the horizontal cross section of the semiconductor laser element depicted in FIG. 5.

FIG. 13 is a diagram illustrating still another modified example of the horizontal cross section of the semiconductor laser element depicted in FIG. 5. It differs from the one depicted in FIG. 5 in that the active layer 3B (light-emitting layer 3) is not shaped into a rectangle but a triangle within the YZ plane. The base of this isosceles triangle is superposed on the laser light exit surface SF within the YZ plane. The shortest distances ZB2, YR2, YL2 between the active layer 3B (light-emitting layer 3) and the three end faces SB, SR, SL of the semiconductor laser element for sufficiently suppressing end-face reflection are at least 50 µm on each.

While the base layer 4A of the diffraction grating layer 4 is adjacent to the side faces of the light-emitting layer 3 in the above-mentioned embodiment, an effective diffraction grating will be located beside the active layer 3B within the YZ plane passing the active layer 3B (light-emitting layer) if the different refractive index parts 4B embedded in the base layer 4A are made deeper on the outside of the region directly under the upper electrode. A distributed light reflection region constituted by such a diffraction grating is effective in enhancing the light confinement effect produced by the diffraction grating. This distributed light reflection region is constituted by a photonic crystal.

As explained in the foregoing, the end-face-emitting photonic crystal laser element in accordance with this embodiment suppresses the laser oscillation of the Fabry-Perot mode, so that the laser oscillation of the mode resulting from the diffraction grating layer becomes dominant, whereby stable laser light can be emitted.

Reference Signs List

10 . . . end-face-emitting photonic crystal laser element; SF . . . laser light exit surface; SB . . . opposite end face; SR, SL, . . . lateral end face; E2 . . . upper electrode.

The invention claimed is:

1. An end-face-emitting photonic crystal laser element comprising:
   a lower cladding layer comprised of a semiconductor;
   an upper cladding layer comprised of a semiconductor;
   an active layer including a quantum well layer disposed between the lower and upper cladding layers, the quantum well layer having a plurality of barrier layers and a well layer located between the barrier layers, the barrier layers having an energy band gap smaller than that of any of the lower and upper cladding layers;
   a diffraction grating layer having a region disposed between at least one of the lower and upper cladding layers and the active layer;
   a lower electrode disposed on a surface of the lower cladding layer; and
   an upper electrode disposed on a surface of the upper cladding layer, wherein a shape of the upper electrode is substantially a square or a circle;
   wherein, in an XYZ orthogonal coordinate system with X, Y, and Z axes respectively lying in thickness, width, and length directions of the element, the end-face-emitting photonic crystal laser element has a laser light exit surface along an XY plane;
   wherein the end-face-emitting photonic crystal laser element has four end faces surrounding the X axis;
   wherein one of the end faces is the laser light exit surface, each of the others being displaced from the active layer more than 50 μm in a YZ plane; and
   wherein, when referring to the surface opposing the laser light exit surface in the end faces as an opposite end face and the remaining pair of end faces as lateral end faces and seeing in the X axis, one end of the upper electrode overlaps the laser light exit surface, the upper electrode and the opposite end face are separated from each other, the upper electrode is separated from both of the lateral end faces, and one end of the active layer overlaps the laser light exit surface.

2. An end-face-emitting photonic crystal laser element according to claim 1,
   wherein, when seen in the X axis, the active layer and the opposite end face are separated from each other, the active layer is separated from both of the lateral end faces, and the active layer is in contact with a semiconductor material having a wider energy bandgap than that of the well layer except for the laser light exit surface within a YZ plane including the active layer.

3. An end-face-emitting photonic crystal laser element according to claim 2, wherein the semiconductor material has an energy bandgap wider than that corresponding to the laser resonance wavelength along the Z axis in the active layer.

4. An end-face-emitting photonic crystal laser element according to claim 2, wherein the diffraction grating layer comprises:
   a base layer comprised of the semiconductor material; and
   a plurality of different refractive index parts, located periodically within the base layer, having a refractive index different from that of the base layer; and
   wherein the base layer is in contact with the active layer within the YZ plane including the active layer.

5. An end-face-emitting photonic crystal laser element according to claim 3, wherein the diffraction grating layer comprises:
   a base layer comprised of the semiconductor material; and
   a plurality of different refractive index parts, located periodically within the base layer, having a refractive index different from that of the base layer; and
   wherein the base layer is in contact with the active layer within the YZ plane including the active layer.

* * * * *